(12) United States Patent
Kato et al.

(10) Patent No.: US 11,152,547 B2
(45) Date of Patent: Oct. 19, 2021

(54) METALLIC STRUCTURE FOR OPTICAL SEMICONDUCTOR DEVICE, METHOD FOR PRODUCING THE SAME, AND OPTICAL SEMICONDUCTOR DEVICE USING THE SAME

(71) Applicant: NICHIA CORPORATION, Anan (JP)

(72) Inventors: Yasuo Kato, Anan (JP); Kazuya Matsuda, Anan (JP)

(73) Assignee: NICHIA CORPORATION, Anan (JP)

( * ) Notice: Subject to any disclaimer, the term of this patent is extended or adjusted under 35 U.S.C. 154(b) by 193 days.

(21) Appl. No.: 16/584,038

(22) Filed: Sep. 26, 2019

(65) Prior Publication Data

US 2020/0105986 A1 Apr. 2, 2020

(30) Foreign Application Priority Data

Sep. 27, 2018 (JP) .............................. JP2018-182721

(51) Int. Cl.
*H01L 33/62* (2010.01)
*H01L 33/56* (2010.01)
*H01L 23/495* (2006.01)

(52) U.S. Cl.
CPC ........ *H01L 33/56* (2013.01); *H01L 23/49582* (2013.01); *H01L 33/62* (2013.01)

(58) Field of Classification Search
CPC .... H01L 23/49582; H01L 33/56; H01L 33/62
USPC .......................................................... 257/99
See application file for complete search history.

(56) References Cited

U.S. PATENT DOCUMENTS

| 6,567,604 B1* | 5/2003 | Yeh ...................... G02B 6/4248 385/134 |
| 9,576,693 B2 | 2/2017 | Shibuya et al. |
| 2004/0195580 A1* | 11/2004 | Nishizawa .............. H01L 33/00 257/99 |
| 2012/0313131 A1* | 12/2012 | Oda ..................... H01L 21/4828 257/98 |
| 2014/0329107 A1 | 11/2014 | Shibuya et al. |
| 2018/0016689 A1 | 1/2018 | Qin et al. |

FOREIGN PATENT DOCUMENTS

| JP | 53-75178 A | 7/1978 |
| JP | 2003-347596 A | 12/2003 |
| JP | 2006-93365 A | 4/2006 |
| JP | 2012-39109 A | 2/2012 |
| JP | 2013-26427 A | 2/2013 |
| JP | 2013-79439 A | 5/2013 |
| JP | 2017-5265 A | 1/2017 |
| JP | 2017-92500 A | 5/2017 |
| JP | 2018-12886 A | 1/2018 |

\* cited by examiner

*Primary Examiner* — Long K Tran

(74) *Attorney, Agent, or Firm* — Birch, Stewart, Kolasch & Birch, LLP

(57) ABSTRACT

A metallic structure for an optical semiconductor device including a conductive base body having disposed thereon metallic layers in the following order: a nickel or nickel alloy plated layer, a gold or gold alloy plated layer, and an indium or indium alloy plated layer, wherein the indium or indium alloy plated layer has a thickness in a range of 0.002 μm or more and 0.3 μm or less.

10 Claims, 10 Drawing Sheets

METALLIC STRUCTURE FOR OPTICAL SEMICONDUCTOR DEVICE, METHOD FOR PRODUCING THE SAME, AND OPTICAL SEMICONDUCTOR DEVICE USING THE SAME

CROSS-REFERENCE TO RELATED PATENT APPLICATION

This application claims priority to Japanese Patent Application No. 2018-182721, filed on Sep. 27, 2018, the disclosure of which is hereby incorporated reference in its entirety.

BACKGROUND

Technical Field

The present disclosure relates to a metallic structure for an optical semiconductor device, a method for producing the same, and an optical semiconductor device using the same.

Description of Related Art

An optical semiconductor device comprising a semiconductor light emitting element (hereinafter, also referred to as "light emitting element") such as a light emitting diode (hereinafter, also referred to as "LED") or a laser diode (hereinafter, also referred to as "LD") is being utilized as a light source for vehicles, ordinary lighting, backlight of liquid crystal display devices, projectors.

In the optical semiconductor device, a lead frame or a substrate, on which a silver or silver alloy plating having high reflectance with respect to light emitted from the light emitting element is provided, is employed. However, the silver or silver alloy is easily sulfurized by sulfide and discolored by the sulfidation, and then the reflectance is lowered. Japanese Unexamined Patent Publication No. 2003-347596 and Japanese Unexamined Patent Publication No. 2006-093365 disclose an optical semiconductor device comprising a substrate provided with a gold plating having a reflectance lower than that of silver, but excellent in sulfidation resistance than silver on the surface. The optical semiconductor device comprising a lead frame or a substrate provided with gold or a gold alloy on the surface is utilized as, for example, an on-vehicle optical semiconductor device requiring high reliability.

Thus, an embodiment of the present disclosure has an object to provide a metallic structure for an optical semiconductor device having enhanced adhesion to resin materials, a method for producing the same, and an optical semiconductor device using the same.

SUMMARY

The metallic structure for an optical semiconductor device according to the embodiment of the present disclosure includes a conductive base body having disposed thereon metallic layers in the following order: a nickel or nickel alloy plated layer, a gold or gold alloy plated layer, and an indium or indium alloy plated layer, wherein the indium or indium alloy plated layer has a thickness in a range of 0.002 μm or more and 0.3 μm or less.

The optical semiconductor device according to the embodiment of the present disclosure is an optical semiconductor device in which a light emitting element is mounted on a lead frame or a substrate composed of the metallic structure for an optical semiconductor device.

The method for producing a metallic structure for an optical semiconductor device according to the embodiment of the present disclosure which includes forming metallic layer on a conductive base body in a following order steps: forming a nickel or nickel alloy plated layer on the conductive base body, optionally forming a rhodium, palladium, rhodium alloy, or palladium alloy plated layer on the nickel or nickel alloy plated layer, forming a gold or gold alloy plated layer on the nickel or nickel alloy plated layer or optionally on the rhodium, palladium, rhodium alloy or palladium alloy plated layer if it present, and forming an indium or indium alloy plated layer on the gold or gold alloy plated layer, which the indium or indium alloy plated layer has a thickness in a range of 0.002 μm or more and 0.3 μm or less.

In accordance with the embodiments of the present disclosure, a metallic structure for an optical semiconductor device having enhanced adhesion to resin materials, a method for producing the same, and an optical semiconductor device using the same, can be provided.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Figure 1A:
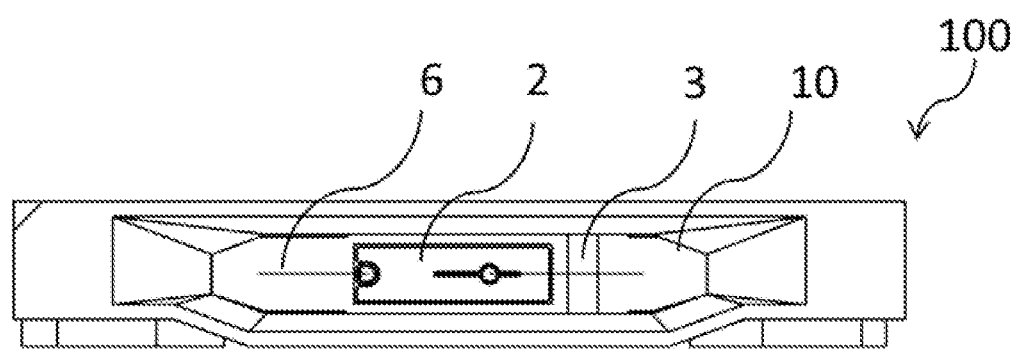
FIG. 1A is a schematic plan view illustrating an optical semiconductor device according to an embodiment of the present disclosure.

The embodiments will now be described with reference to the accompanying drawings, wherein like reference numerals designate corresponding or identical elements throughout the various drawings.

The embodiments of the present disclosure will be hereunder described with reference to the drawings as appropriate. The metallic structure for an optical semiconductor device, the method for producing the same, and the optical semiconductor device using the same described below are exemplifications for embodying the technical idea of the present disclosure, and unless otherwise specified, the present disclosure is not limited to the following. The compositions of the plating solution and the plating operation conditions described in the embodiments are examples. Further, the constitutions described in the embodiments can be employed in other embodiments. The sizes and the arrangement relationships of the members described in the drawings are occasionally shown exaggerated for ease of explanation. In the description below, the same name or symbol basically represents the same or equivalent member, and detailed description will be omitted as appropriate.

First Embodiment

Optical Semiconductor Device

Figure 1B:
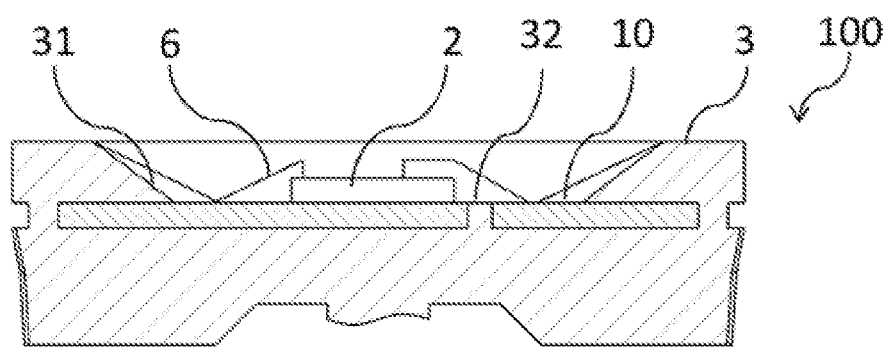
FIG. 1B is a schematic cross-sectional view of the optical semiconductor device in FIG. 1A.

The structure of an optical semiconductor device 100 according to a first embodiment is shown in FIG. 1A and FIG. 1B. The optical semiconductor device 100 according to the present embodiment comprises a light emitting element 2 having a rectangular shape in plan view, a pair of lead frames 10 each composed of a plate-shaped metallic structure for an optical semiconductor device 1 (hereinafter, also simply referred to as "lead frame 10"), and a resin molded body 3 in which a part of the lead frame 10 is embedded.

The resin molded body 3 is composed of a resin composition containing a thermoplastic resin or a thermosetting resin. The resin molded body 3 forms a recessed part having a bottom surface and a side surface, a part of the bottom surface of the recessed part is composed of a pair of the lead frames 10, and the side surface is formed with a reflection surface 31 having a predetermined inclination angle. The resin composition constituting the resin molded body 3 is embedded between the pair of lead frames 10 to constitute a part of the bottom surface 32 of the resin molded body 3. The resin molded body 3 has a horizontally long shape in plan view. The resin molded body 3 has horizontally long recessed parts, in which the lead frames 10 are exposed to the bottom surface. Apart of the pair of plate-shaped lead frames 10 is exposed to the outside surface of the resin molded body 3 as an external terminal part, and the external terminal part is bent along the lower surface of the resin molded body 3. The light emitting element 2 is mounted on one of the pair of lead frames 10 constituting the bottom surface of the recessed part. The light emitting element 2 is covered with a sealing member 5. For example, the sealing member 5 contains a fluorescent material that undergoes wavelength conversion of light emitted from the light emitting element 2, and a sealing material. The sealing material preferably contains a translucent resin. The fluorescent material is excited with light emitted from the light emitting element 2 to convert the wavelength of the light emitted from the light emitting element 2, and emits light having at least one light emission peak wavelength within a specific wavelength range. In addition, the light emitting element 2 has a pair of positive and negative electrodes, and the pair of positive and negative electrodes each are individually electrically connected to the pair of lead frames 10 via wires 6. The optical semiconductor device 100 is able to emit light upon receiving external power via the pair of lead frames 10. A lead frame 10 or a substrate composed of a metallic structure for an optical semiconductor device to be explained in the following embodiment has an area in contact with a member that is formed by using the resin material such as the resin molded body 3 or the sealing member 5. In the present specification, the resin material refers to a material containing at least a resin. Examples of the resin material may include a resin composition containing a resin. In this specification, the "fluorescent material" is used in the same meaning as a "phosphor".

Second Embodiment

Metallic Structure for Optical Semiconductor Device

Figure 2A:
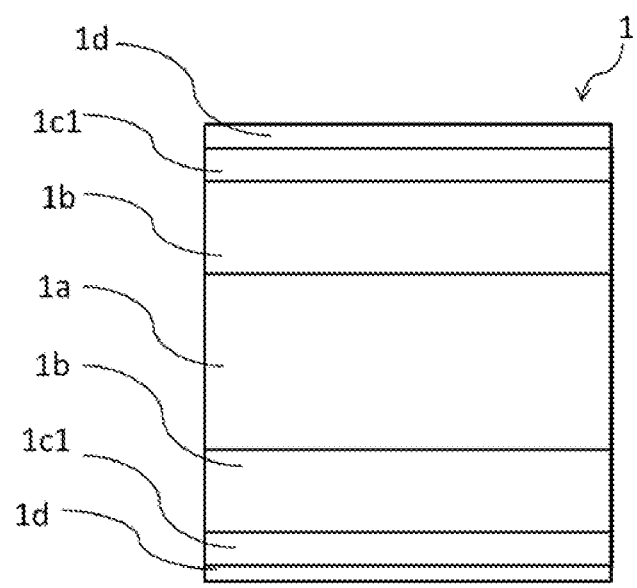
FIG. 2A is a schematic cross-sectional view of a part of a metallic structure for an optical semiconductor device according to an embodiment of the present disclosure.

FIG. 2A is a schematic cross-sectional view illustrating an embodiment of a metallic structure for an optical semiconductor device 1 constituting a lead frame 10 or substrate.

The metallic structure for an optical semiconductor device 1 has a conductive base body 1a composed of, for example, a copper alloy; and a nickel or nickel alloy plated layer 1b, a gold or gold alloy plated layer 1c1, and an indium or indium alloy plated layer 1d having a thickness in a range of 0.002 μm or more and 0.3 μm or less on the base body 1a in this order.

The lead frame 10 composed of the metallic structure for an optical semiconductor device 1 functions as a mounting member for mounting the light emitting element 2, a reflection member for reflecting light emitted from the light emitting element 2, and a conductive member for electrically connecting to the light emitting element 2. Further, the lead frame 10 may function as a heat radiating member for radiating heat generated from the light emitting element 2. The lead frame 10 composed of the metallic structure for an optical semiconductor device 1 may be provided below the light emitting element 2 as in the first embodiment, or may also be provided in a reflector shape surrounding the light emitting element 2. The lead frame 10 may be a plate-shaped lead frame. The metallic structure for an optical semiconductor device 1 may be used as a wiring formed on an insulating base body.

The metallic structure for an optical semiconductor device 1 has an indium or indium alloy plated layer 1d having a thickness in a range of 0.002 μm or more and 0.3 μm or less as a surface layer. Thus, the metallic structure for an optical semiconductor device 1 has better adhesion to a resin as compared with the case of using a gold or gold alloy plating, and for example, the adhesion to the sealing member 5 and the resin molded body 3 can be improved in the optical semiconductor device 100. Since the lead frame 10 composed of the metallic structure for an optical semiconductor device 1 has high adhesion to resin materials, entering of solder in the optical semiconductor device and leakage of the sealing material (hereinafter, this may be referred to as "sealing resin") to the outside of the resin molded body 3 can be prevented in a step of solder reflow-mounting the optical semiconductor device 100 using the lead frame 10 on a printed board.

Further, since the metallic structure for an optical semiconductor device 1 has an indium or indium alloy plated layer 1d having a thickness in a range of 0.002 μm or more and 0.3 μm or less as a surface layer and a gold or gold alloy plated layer 1c1 as a base layer for the indium or indium alloy plated layer 1d, discoloration due to sulfidation can be suppressed by having the indium or indium alloy plated layer 1d or the gold or gold alloy plated layer 1c1 which is less reactive with sulfide, lowering of luminous flux due to the sulfidation discoloration can be suppressed, and high luminous flux can be maintained.

As shown in FIG. 2A, in a pair of two surfaces against each other on a base body 1a as a center, the metallic structure for an optical semiconductor device 1 has nickel or nickel alloy plated layers 1b, gold or gold alloy plated layers 1c1, and indium or indium alloy plated layers 1d on the base body 1a in this order. In two pairs of four surfaces against each other on a plate-shaped base body 1a as a center, the metallic structure for an optical semiconductor device 1 may have nickel or nickel alloy plated layers 1b, gold or gold alloy plated layers 1c1, and indium or indium alloy plated layers 1d so as to wrap around the base body 1a in this order. The pair of two surfaces against each other on the plate-shaped base body 1a may be respectively referred to as an upper surface and a bottom surface, and the other two surfaces against each other on the plate-shaped base body 1a may be referred to as side surfaces.

In the metallic structure for an optical semiconductor device 1, the reflectance with respect to light having a light emission peak wavelength at 450 nm is preferably in a range of 30% or more and 90% or less. The reflectance of the metallic structure for an optical semiconductor device is more preferably in a range of 32% or more and 85% or less, even more preferably in a range of 34% or more and 82% or less.

The surface of the metallic structure for an optical semiconductor device 1 is coated with an indium or indium alloy plated layer 1d having a thickness in a range of 0.002 μm or more and 0.3 μm or less, and the base layer is a gold or gold alloy plated layer 1c1. Thus, although it depends on the thickness, the reflectance of the metallic structure for an optical semiconductor device 1 is affected by the reflectances of the indium or indium alloy plated layer 1d and the gold or gold alloy plated layer 1c1. When the reflectance of the metallic structure for an optical semiconductor device 1 with respect to light having a light emission peak wavelength at 450 nm is in a range of 30% or more and 90% or less, the reflectance becomes a value obtained by combining the reflectances of the indium or indium alloy plated layer 1d serving as a surface layer and the gold or gold alloy plated layer 1c1, the adhesion to the sealing member 5 or the resin molded body 3, which is a resin material, becomes excellent by having the indium or indium alloy plated layer 1d provided on the surface layer, and entering of solder in the optical semiconductor device and leakage of the sealing material to the outside can be suppressed in a step of solder reflow-mounting the optical semiconductor device. Also, when the reflectance of the metallic structure for an optical semiconductor device 1 with respect to light having a light emission peak wavelength at 450 nm is in a range of 30% or more and 90% or less, the light emitted from the light emitting element 2 and the light of which the wavelength is converted by a fluorescent material are sufficiently reflected, so that high light emission efficiency can be maintained. When the reflectance of the metallic structure for an optical semiconductor device 1 is less than 30%, the reflectance becomes a value closer to the reflectance of the gold or gold alloy plating serving as a base layer than the reflectance of the indium or indium alloy plating serving as a surface layer. When the reflectance of the metallic structure for an optical semiconductor device 1 is more than 90%, the reflectance becomes a value close to the reflectance of the indium or indium alloy plating.

In the metallic structure for an optical semiconductor device 1, the chromaticity represented by the b* value in the L*a*b* color system is preferably in a range of 0 or more and 40 or less. The chromaticity represented by the b* value in the metallic structure for an optical semiconductor device 1 is more preferably in a range of 1 or more and 38 or less, even more preferably in a range of 1 or more and 36 or less. The surface of the metallic structure for an optical semiconductor device 1 is coated with the indium or indium alloy plated layer 1d having a thickness in a range of 0.002 μm or more and 0.3 μm or less, the gold or gold alloy plated layer 1c1 is used as a base layer, and the metallic structure for an optical semiconductor device 1 has a chromaticity obtained by combining the chromaticities of the indium or indium alloy plated layer 1d serving as a surface layer and the gold or gold alloy plated layer 1c1. The chromaticity of the metallic structure for an optical semiconductor device 1 may be changed depending on the thickness of the indium or indium alloy plated layer 1d, as well as the thickness of the gold or gold alloy plated layer 1c1 serving as a base layer. When the b* value of the metallic structure for an optical semiconductor device 1 is in a range of 0 or more and 40 or less, the b* value becomes a value obtained by combining the b* values of the indium or indium alloy plated layer 1d and the gold or gold alloy plated layer 1c1, the adhesion to the sealing member 5 or the resin molded body 3, which is formed by using a resin material, becomes excellent, and entering of solder in the optical semiconductor device and leakage of the sealing material to the outside can be suppressed in a step of solder reflow-mounting the optical semiconductor device. When the b* value of the metallic structure for an optical semiconductor device 1 in the L*a*b* color system is less than 0, the b* value becomes a value close to the b* value that represents the chromaticity of the indium or indium alloy plating serving as a surface layer. In addition, when the b* value of the metallic structure for an optical semiconductor device 1 in the L*a*b* color system is more than 40, the b* value becomes a value close to the b* value that represents the chromaticity of the gold or gold alloy plated layer 1c1 serving as a base layer.

Indium or Indium Alloy Plated Layer 1d

The indium or indium alloy plated layer 1d is provided on the surface of the metallic structure for an optical semiconductor device 1. The thickness of the indium or indium alloy plated layer 1d is in a range of 0.002 μm or more and 0.3 μm or less, and preferably in a range of 0.003 μm or more and 0.25 μm or less, more preferably in a range of 0.003 μm or more and 0.20 μm or less. When the thickness of the indium or indium alloy plated layer 1d is less than 0.002 μm, the adhesion to the resin materials may be lowered, and in the optical semiconductor device 100 using the metallic structure for an optical semiconductor device 1 as a lead frame or a substrate, the adhesion to the sealing member 5 and the resin molded body 3 may be lowered. In addition, when the thickness of the indium or indium alloy plated layer 1d is more than 0.3 μm, the melting point of the metallic structure for an optical semiconductor device is remarkably lowered, and solder may be impregnated into the optical semiconductor device at the time of, for example, solder reflow-mounting the optical semiconductor device.

As a material for the indium or indium alloy plated layer 1d, indium alone, or an alloy of indium and at least one metal selected from gold, silver, and tin can be used. In the case of using an indium alloy, the ratio of indium is preferably about 70% by mass to 99% by mass.

The indium or indium alloy plated layer 1d does not need to be provided on all surfaces of the metallic structure for an optical semiconductor device 1. That is, the indium or indium alloy plated layer 1d may be provided on at least a part of the surface of the metallic structure for an optical semiconductor device 1. For example, in the lead frame 10 which is not exposed to the bottom surface of the recessed part of the resin molded body 3 shown in FIG. 1A and FIG. 1B, the indium or indium alloy plated layer 1d is required on the surfaces of an embedded part embedded inside a side wall part of the resin molded body 3 and an embedded part closely adhering to the sealing member 5 for improving the adhesion with the resins, but the indium or indium alloy plated layer 1d may not be provided on the surfaces of an external terminal part exposed to the outside of the resin molded body 3 and a mounting part exposed to the bottom surface side of the optical semiconductor device. In order to provide the indium or indium alloy plated layer 1d on a part of the metallic structure for an optical semiconductor device 1 as described above, a part not requiring the indium or indium alloy plated layer 1d is masked with protective tape at the time of forming the indium or indium alloy plated layer 1d, so that the indium or indium alloy plated layer 1d can be formed on a part of the surface.

The indium or indium alloy plated layer 1d may be provided on the pair of opposing two surfaces, for example, the upper surface and the bottom surface of the plate-shaped metallic structure for an optical semiconductor device 1 as shown in the present embodiment, or may be provided on only one surface and may not be provided on another surface if the part is not directly adhered to the resin molded body 3 or the sealing member 5. Further, it may be provided on only a part of one surface. In the indium or indium alloy plated layer 1d, the thickness may be the same or different over the entire region provided. By changing the thickness of the indium or indium alloy plated layer 1d at each area, the cost can be more effectively reduced. For example, when the indium or indium alloy plated layer 1d is provided on the upper surface and the bottom surface of the metallic structure for an optical semiconductor device 1, the thickness on one surface may be thicker than the other surface. By providing a relatively thick indium or indium alloy plated layer 1d on a part directly adhered to the resin molded body 3 or the sealing member 5, entering of solder in the optical semiconductor device 100 can be effectively prevented at the time of, for example, solder reflow-mounting the optical semiconductor device 100 on a printed board.

Base Body 1a

The metallic structure for an optical semiconductor device 1 has a base body 1a on which the indium or indium alloy plated layer 1d is laminated as a surface layer. In the present embodiment, the base body 1a is used as a material for determining a rough shape of the metallic structure for an optical semiconductor device 1.

As a material for the base body 1a, copper, iron, an alloy of these, or a clad material (for example, lamination of copper/iron-nickel alloy/copper) can be suitably used. Copper or an alloy thereof can be preferably used since the heat radiation property is excellent. A plate-shaped copper and a copper alloy are particularly preferred since the mechanical characteristics, the electric characteristics, and the workability are also excellent. The clad material is able to suppress the linear expansion coefficient to be low, and thus the reliability of the optical semiconductor device 100 can be improved.

The thickness and shape of the base body 1a can be selected depending on the shape of the optical semiconductor device 100. Examples of the shape may include a plate shape, a lump shape, and a film shape. Further, the shape may be a wiring pattern provided on a ceramic or the like by printing, or the shape may be obtained by plating copper or an alloy thereof on the formed wiring pattern.

In order to enhance the light reflectance of the metallic structure for an optical semiconductor device 1, the flatness of the base body 1a is preferably high as much as possible. For example, the surface roughness Ra of the base body 1a is preferably 0.5 µm or less. With this arrangement, the flatness of each of the nickel or nickel alloy plated layer 1b provided on the base body 1a, the gold or gold alloy plated layer 1c1, the following rhodium, palladium, rhodium alloy, or palladium alloy plated layer 1c2 provided as necessary, and the indium or indium alloy plated layer 1d can be enhanced. When the flatness of the base body 1a is high, the flatness of the indium or indium alloy plated layer 1d having a thickness in a range of 0.002 µm or more and 0.3 µm or less can also be enhanced, and the reflectance of the metallic structure for an optical semiconductor device 1 can be satisfactorily enhanced. The flatness of the base body 1a can be enhanced by performing a treatment such as a rolling treatment, a physical polishing, or a chemical polishing. The flatness of the base body 1a can be also enhanced by plating the same kind of material as that of the material constituting the base body 1a. For example, in the case of a base body 1a made of a copper alloy, the flatness of the base body 1a can be enhanced by performing copper alloy plating.

Nickel or Nickel Alloy Plated Layer 1b

The metallic structure for an optical semiconductor device 1 according to the present embodiment has a nickel or nickel alloy plated layer 1b on the base body 1a.

The thickness of the nickel or nickel alloy plated layer 1b is preferably in a range of 0.5 µm or more and 10 µm or less, more preferably in a range of 1 µm or more and 10 µm or less. When the thickness of the nickel or nickel alloy plated layer 1b is 0.5 µm or more, a metal contained in the base body 1a can be effectively suppressed from being diffused to the gold or gold alloy plated layer 1c1 serving as a base layer and the indium or indium alloy plated layer 1d serving as a surface layer from the base body 1a. For example, when the base body 1a contains copper, the copper can be suppressed from being diffused to the gold or gold alloy plated layer 1c1 and the indium or indium alloy plated layer 1d from the base body 1a. When the thickness of the nickel or nickel alloy plated layer 1b is 10 µm or less, the cost of raw materials and production can be reduced. As a material for the nickel or nickel alloy plated layer 1b, for example, nickel, or an alloy such as nickel phosphorus, nickel tin, or nickel cobalt can be used.

Gold or Gold Alloy Plated Layer 1c1

The metallic structure for an optical semiconductor device 1 according to the present embodiment has a gold or gold alloy plated layer 1c1 as a base layer for the indium or indium alloy plated layer 1d serving as a surface layer. In addition to the gold or gold alloy plated layer 1c1, a plurality of layers made of different materials may be provided as a base layer 1c for a surface layer for various purposes.

The gold or gold alloy plated layer 1c1 is preferably a gold or gold alloy plated layer 1c1 having difficulty to be reacted with sulfur components. Gold is particularly preferred. The thickness of the gold or gold alloy plated layer 1c1 is preferably in a range of 0.01 µm or more and 1 µm or less, more preferably in a range of 0.02 µm or more and 0.9 µm or less, even more preferably in a range of 0.03 µm or more and 0.8 µm or less. When the thickness of the gold or gold alloy plated layer is 0.01 µm or more, the wire bonding property of the wire 6 and the die bonding property with the light emitting element are improved. In addition, when the thickness of the gold or gold alloy plated layer is 1 µm or less, the material cost can be reduced. As the gold alloy, gold cobalt, gold nickel, gold indium, gold palladium, and the like are preferred.

Third Embodiment

Metallic Structure for Optical Semiconductor Device

Figure 2B:
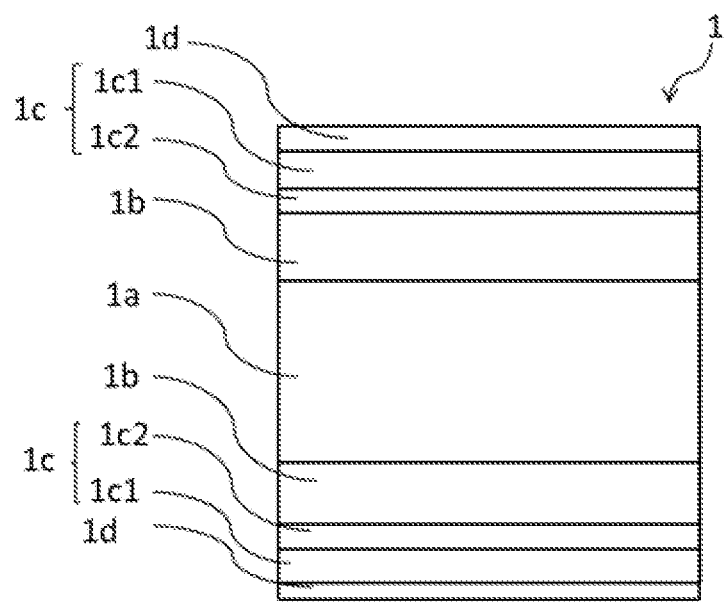
FIG. 2B is a schematic cross-sectional view of a part of a metallic structure for an optical semiconductor device according to another embodiment of the present disclosure.

FIG. 2B is a schematic cross-sectional view illustrating another embodiment of the metallic structure for an optical semiconductor device 1 constituting the lead frame 10. The metallic structure for an optical semiconductor device 1 preferably has a rhodium, palladium, rhodium alloy, or palladium alloy plated layer 1c2 as a base layer 1c between the nickel or nickel alloy plated layer 1b and the gold or gold alloy plated layer 1c1.

Rhodium, Palladium, Rhodium Alloy, or Palladium Alloy Plated Layer 1c2

The metallic structure for an optical semiconductor device 1 according to the present embodiment preferably has a rhodium, palladium, rhodium alloy, or palladium alloy plated layer 1c2 as a base layer in contact with the nickel or nickel alloy plated layer 1b. For example, in the case of using a base body 1a made of a material containing copper, it is preferable that the nickel or nickel alloy plated layer 1b is provided on the base body 1a, the rhodium, palladium, rhodium alloy, or palladium alloy plated layer 1c2 is further provided thereon as a second base layer, the gold or gold alloy plated layer 1c1 is provided on the second base layer as a first base layer, and the indium or indium alloy plated layer 1d is laminated on the surface layer in this order. By using such a structure, for example, when the base body 1a contains copper, the copper contained in the base body 1a can be suppressed from being diffused to the gold or gold alloy plated layer 1c1 and the indium or indium alloy plated layer 1d serving as the surface layer, and the adhesion to the gold or gold alloy plated layer 1c1 and the indium or indium alloy plated layer 1d can be enhanced. In addition, by suppressing the diffusion of the copper contained in the base body 1a, the wire bonding property can be enhanced in the case of using the metallic structure for an optical semiconductor device 1 for the lead frame 10.

The thickness of the rhodium, palladium, rhodium alloy, or palladium alloy plated layer 1c2 is preferably in a range of 0.01 μm or more and 0.3 μm or less, more preferably in a range of 0.02 μm or more and 0.2 μm or less, even more preferably in a range of 0.03 μm or more and 0.1 μm or less. When the thickness of the rhodium, palladium, rhodium alloy, or palladium alloy plated layer 1c2 is in a range of 0.01 μm or more and 0.3 μm or less, a metal (for example, copper) contained in the base body 1a can be suppressed from being diffused to the other base layer and surface layer, and the adhesion to each layer can be enhanced.

The base layer 1c for the indium or indium alloy plated layer 1d, which contains the first base layer 1c1 and the second base layer 1c2, may be a layer acting both of preventing the sulfidation and the diffusion of the metal contained in the base body 1a to the other layers. Thereby, the cost can be reduced. For example, gold can be preferably used since gold is hardly reacted with a sulfur component and the effect of preventing diffusion of the metal contained in base body 1a is also high.

The metallic structure for an optical semiconductor device 1 is preferably in the form of a substantially flat plate as shown in, for example, FIG. 3A and FIG. 3B described below. Thereby, the reliability of the metallic structure for an optical semiconductor device 1 can be enhanced. Since the nickel or nickel alloy plated layer 1b is slightly weaker than a material used as the base body 1a, such as copper, iron, an alloy of these, or a clad material (for example, lamination of copper/iron-nickel alloy/copper), the metallic structure for an optical semiconductor device 1 comprising the nickel or nickel alloy plated layer 1b is preferably used in the form of flat plate without being bent.

Fourth Embodiment

Optical Semiconductor Device

Figure 3A:
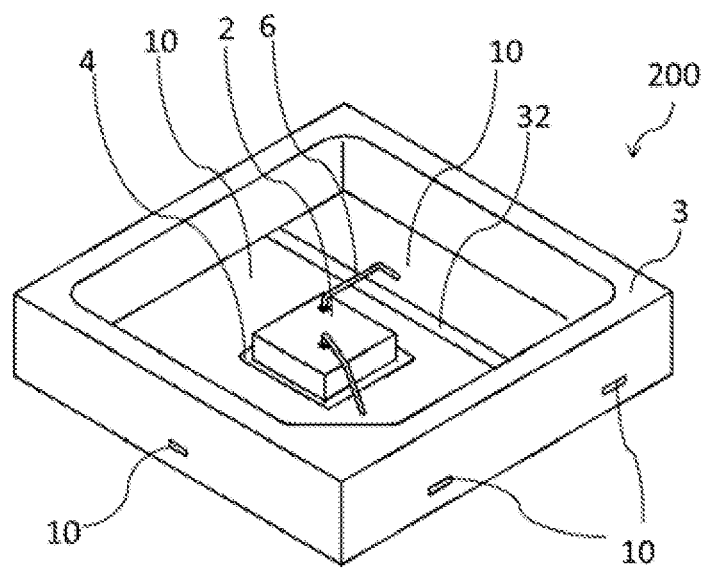
FIG. 3A is a schematic perspective view illustrating an optical semiconductor device according to another embodiment of the present disclosure.
Figure 3B:
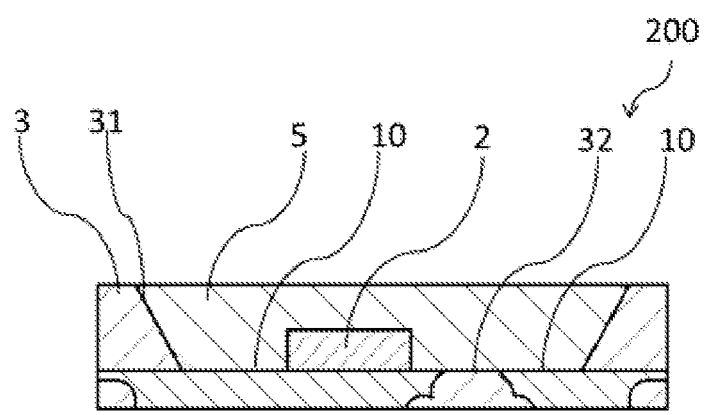
FIG. 3B is a schematic cross-sectional view of the optical semiconductor device in FIG. 3A.

The structure of an optical semiconductor device 200 according to a fourth embodiment is shown in FIG. 3A and FIG. 3B. The optical semiconductor device 200 according to the present embodiment has a lead frame 10 having no bent part. Members common to the optical semiconductor device 100 according to the first embodiment are given the same reference numerals.

Next, the members constituting the optical semiconductor device 100 according to the first embodiment and the optical semiconductor device 200 according to the fourth embodiment will be described.

Light Emitting Element 2

As a light emitting element 2, a semiconductor light emitting element having an arbitrary wavelength can be selected. For example, as a blue or green light emitting element 2, a light emitting element using a nitride-based semiconductor such as InGaN, GaN, or AlGaN; or GaP can be used. For example, as a red light emitting element, a light emitting element using GaAlAs, AlInGaP can be used. Further, a light emitting element 2 composed of other materials can also be used. The composition, light emitting color, size, and number of the light emitting element 2 to be used can be appropriately selected depending on the purpose.

When the optical semiconductor device comprises a member capable of converting wavelength, a nitride semiconductor capable of emitting light having a short wavelength, which can efficiently excite the member capable of converting wavelength, can be suitably used. The light emission wavelength can be variously selected depending on the material of the semiconductor layer and the mixed crystal ratio thereof. Further, a light emitting element 2 capable of emitting not only light in the visible light region but also ultraviolet light or infrared rays can be used.

The light emitting element 2 is preferably mounted on a lead frame 10 or a substrate composed of the metallic structure for an optical semiconductor device 1. With this arrangement, the light extraction efficiency of the optical semiconductor device can be improved.

The light emitting element 2 has positive and negative electrodes electrically connected to conductive members. The positive and negative electrodes may be provided on one surface side, or may be provided on both upper and lower surfaces of the light emitting element 2. The positive and negative electrodes may be connected to the conductive members by using joining members 4 and wires 6 described below, or by flip-chip mounting.

Resin Molded Body 3

The resin molded body 3 is a member composed of a resin composition which integrally holds a pair of lead frames 10. The shape of the resin molded body 3 in plan view may be a substantially rectangular shape in which a pair of opposite sides are longer than the other opposite sides as shown in FIG. 1A, or may be a quadrangle as shown in FIG. 3A. In addition, the resin molded body 3 can be formed into a polygonal shape or a combination thereof. When the resin molded body 3 has a recessed part, the inner side surface of the recessed part, which is a side wall part 31, may have an inclined surface provided at an angle inclined with respect to the bottom surface as shown in FIG. 3B, may have a substantially vertical angle, or may have a step surface. The height and the shape of the opening can be appropriately selected depending on the purpose and application. Lead frames 10 are preferably provided inside the recessed part. A resin composition constituting the resin molded body 3 is embedded between the pair of lead frames 10 to form a part of the bottom surface 32 of the resin molded body 3.

The resin molded body 3 can be formed using a resin composition containing a thermosetting resin or a thermoplastic resin. In particular, it is preferable to use a resin composition containing a thermosetting resin. The composition containing a thermosetting resin is preferably a resin having lower gas permeability than that of the resin used in the sealing member 5, and specific examples thereof may include an epoxy resin composition, a silicone resin composition, a modified epoxy resin composition such as silicone-modified epoxy resin, a modified silicone resin composition such as epoxy-modified silicone resin, a polyimide resin composition, a modified polyimide resin composition, a urethane resin, and a modified urethane resin composition. The resin composition constituting the resin molded body 3 may contain at least one kind of inorganic particles selected from $TiO_2$, $SiO_2$, $Al_2O_3$, MgO, $MgCO_3$, $CaCO_3$, $Mg(OH)_2$, and $Ca(OH)_2$ as a filler. By containing inorganic particles in the resin composition constituting the resin molded body 3 as a filler, the light transmittance of the resin molded body 3 can be adjusted.

A member for holding the lead frames 10 in addition to the resin molded body 3 may be formed of an inorganic material such as ceramic, glass, or metal. With this arrangement, an optical semiconductor device having less deterioration and high reliability can be obtained.

Joining Member 4

The joining member 4 is a member for fixing and mounting the light emitting element 2 on the lead frame 10. As a material for a conductive joining member 4, a conductive paste containing silver, gold, and palladium, an eutectic solder material such as gold-tin and tin-silver-copper, a brazing material such as a low melting point metal, copper, silver, gold particles, or a material similar to the indium or indium alloy plated layer can be used. As a material for an insulating joining member 4, an epoxy resin composition, silicone resin composition, a polyimide resin composition, a modified resin thereof, a hybrid resin can be used. In the case of using these resins, a metal layer having high reflectance such as an aluminum film or a silver film, or a dielectric reflection film can be provided on the mounting surface of the light emitting element 2 by considering deterioration due to light or heat from the light emitting element 2.

Sealing Member 5

The sealing member 5 is provided so as to cover each member such as the light emitting element 2, the lead frames 10, the wires 6, and the protective film described below. By having the sealing member 5 on the optical semiconductor device, the covered members can be protected from dust, moisture, external force, and the reliability of the optical semiconductor device can be enhanced. In particular, by forming a protective film and then providing the sealing member 5 on the protective film, the protective film can be protected, so that the reliability of the optical semiconductor device can be enhanced.

The sealing member 5 is preferably a member having translucency capable of transmitting light emitted from the light emitting element 2 and having light resistance which is hardly deteriorated by the light. Specific examples of the material used for the sealing member 5 may include insulating resin compositions having translucency capable of transmitting light emitted from the light emitting element, such as a silicone resin composition, a modified silicone resin composition, a modified epoxy resin composition, and a fluororesin composition. In particular, a hybrid resin containing at least one kind of resin having a siloxane skeleton as a base, such as a dimethyl silicone, a phenyl silicone having a small amount of phenyl, or a fluorine-based silicone resin, can be also used.

As a method for forming the sealing member 5, a potting method, a compression molding method, a printing method, a transfer molding method, a jet dispensing method, a spray coating method can be used in the case where the resin is contained in the material constituting the sealing member 5. When the optical semiconductor device comprises a resin molded body 3 having a recessed part, a potting method is preferred, and when the optical semiconductor device uses a base body in the form of flat plate, a compression molding method or a transfer molding method is preferred.

The sealing member 5 is preferably provided so as to be filled inside of the recessed part of the resin molded body 3 as shown in FIG. 1B or FIG. 3B.

The shape of the outer surface of the sealing member 5 can be selected depending on the light distribution characteristics required for the optical semiconductor device. For example, by shaping the upper surface into a convex lens shape, a concave lens shape, a Fresnel lens shape, a rough shape, the directional characteristics and light extraction efficiency of the optical semiconductor device can be adjusted.

The sealing member 5 can also contain a coloring agent, a light diffusing agent, a light reflecting material, various fillers, a wavelength conversion member, and the like.

The wavelength conversion member is a material for wavelength-converting light emitted from the light emitting element 2. When the light emitted from the light emitting element is blue light, an yttrium-aluminum-garnet-based (hereinafter, referred to as "YAG:Ce") fluorescent material, which is one kind of aluminum oxide-based fluorescent material, is preferably used as the wavelength conversion member. Since the YAG:Ce fluorescent material emits yellow color light to be complementary color by partially absorbing blue light emitted from the light emitting element, a high-power optical semiconductor device capable of emitting white color-based mixture light can be relatively easily formed.

Wire 6

The wire 6 connects the light emitting element 2 and the conductive member such as the lead frame 10. As a material for the wire 6, gold, aluminum, copper, or an alloy of these is suitably used. The wire 6 obtained by providing a coating layer on the surface of the core with a material different from that of the core, for example, the wire 6 obtained by coating palladium, a palladium gold alloy, on the surface of the core made of copper as a coating layer can be used. Among others, the material of the wire 6 is preferably selected from any one of a highly reliable gold, silver, and silver alloy. In particular, the material is preferably a silver or silver alloy having high light reflectance. In this case, the wire 6 is preferably coated with a protective film. With this arrangement, sulfidation and disconnection of the wire containing silver can be prevented, and the reliability of the optical semiconductor device can be enhanced. Further, when the base body 1a of the metallic structure for an optical semiconductor device 1 constituting the lead frame 10 is made of copper and the wire 6 is made of silver or a silver alloy, the formation of a local battery between copper and silver can be suppressed by having the nickel or nickel alloy plated layer 1b in the metallic structure for an optical semiconductor device 1. Thereby, deterioration of the lead frame 10 and the wire 6 is suppressed, and a highly reliable optical semiconductor device can be obtained.

Protective Film

The optical semiconductor device may further comprise a protective film. The protective film covers at least an indium or indium alloy plated layer 1d provided on the surface of the metallic structure for an optical semiconductor device 1 constituting the lead frame 10. The protective film is a member for mainly suppressing discoloration or corrosion of the indium or indium alloy plated layer 1d provided on the surface of the metallic structure for an optical semiconductor device 1 constituting the lead frame 10. Further, the protective film may optionally cover the surfaces of the members other than the lead frame 10, such as the light emitting element 2, the joining member 4, the wire 6, and the base body (resin molded body 3), and the surface of the metallic structure for an optical semiconductor device 1 on which the indium or indium alloy plated layer 1d is not provided. When the wire 6 is made of silver or a silver alloy, the protective film is preferably provided so as to cover the wire 6. With this arrangement, sulfidation and disconnection of the wire containing silver can be prevented, and the reliability of the optical semiconductor device can be enhanced.

The protective film is preferably formed by an atomic layer deposition (hereinafter, also referred to as "ALD") method. According to the ALD method, a highly uniform protective film can be formed, and the formed protective film is denser than the protective films obtained by other film forming methods. Thus, for example, sulfidation of the indium or indium alloy plated layer 1d in the metallic structure for an optical semiconductor device 1 constituting the lead frame 10 can be effectively prevented.

Examples of the material for the protective film may include oxides such as $Al_2O_3$, $SiO_2$, $TiO_2$, $ZrO_2$, $ZnO$, $Nb_2O_5$, $MgO$, $In_2O_3$, $Ta_2O_5$, $HfO_2$, $SeO$, $Y_2O_3$, and $SnO_2$; nitrides such as AlN, TiN, and ZrN; and fluorides such as $ZnF_2$ and $SrF_2$. These may be used alone or in mixture. Alternatively, these may be laminated.

Meanwhile, due to a difference in thermal expansion coefficient between the joining member 4 and the lead frame 10, a crack may be formed in the protective film at the periphery of the light emitting element 2, and the indium or indium alloy plated layer 1d in the metallic structure for an optical semiconductor device 1 constituting the lead frame 10 in the vicinity of light emitting element 2 may be oxidized. When the thickness of the indium or indium alloy plated layer 1d in the metallic structure for an optical semiconductor device 1 constituting the lead frame 10 is made extremely thin as in a range of 0.002 μm or more and 0.3 μm or less, the progress of the oxidation is reduced, so that the lowering of the reflectance of the lead frame 10 can be suppressed.

The optical semiconductor device can comprise various members in addition to the above. For example, a zener diode can be mounted as a protection element.

Method for Producing Optical Semiconductor Device

Next, as an example of a method for producing an optical semiconductor device, a method for producing the optical semiconductor device 200 according to the fourth embodiment will be described with reference to FIG. 4A to FIG. 4D.

Figure 4A:
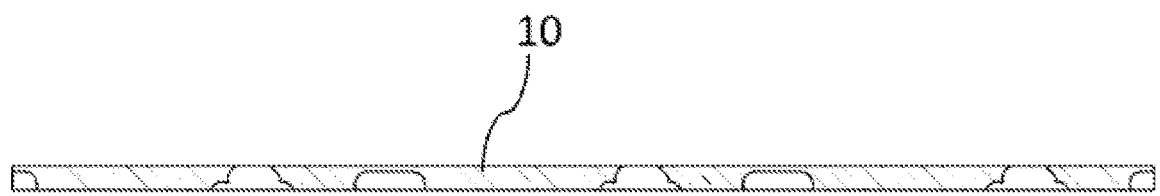
FIG. 4A is a schematic cross-sectional production chart for explaining a method for producing an optical semiconductor device according to an embodiment of the present disclosure.

As shown in FIG. 4A, a lead frame 10 composed of the metallic structure for an optical semiconductor device 1 according to the second or third embodiment of the present disclosure is prepared. Specifically, a metal plate of copper constituting a base body 1a composed of a metallic structure for an optical semiconductor device 1 is punched, and a nickel or nickel alloy plated layer 1b, optionally a rhodium, palladium, rhodium alloy, or palladium alloy plated layer 1c2, a gold or gold alloy plated layer 1c1, and an indium or indium alloy plated layer 1d are formed thereon as described in the following method for producing a metallic structure for an optical semiconductor device 1, thereby forming a lead frame 10 as a lead frame.

Figure 4B:
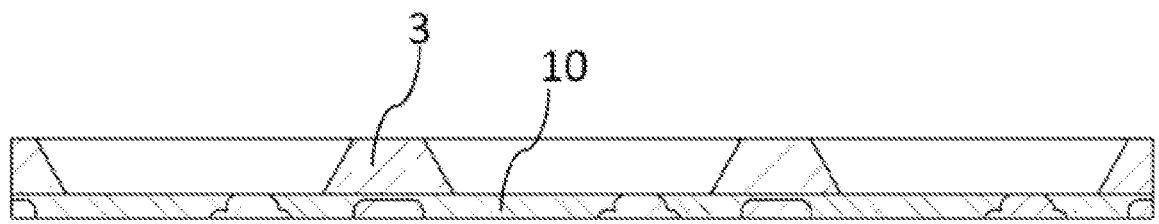
FIG. 4B is a schematic cross-sectional production chart for explaining a method for producing an optical semiconductor device according to an embodiment of the present disclosure.

As shown in FIG. 4B, a resin molded body 3 is formed on the lead frame 10. The resin molded body 3 is formed such that a pair of the lead frames 10 each serving as a lead are respectively exposed to the bottom surface of the recessed part of the resin molded body 3. That is, the lead frames 10 are exposed to each of the bottom surfaces of the recessed parts of the resin molded body 3.

Figure 4C:
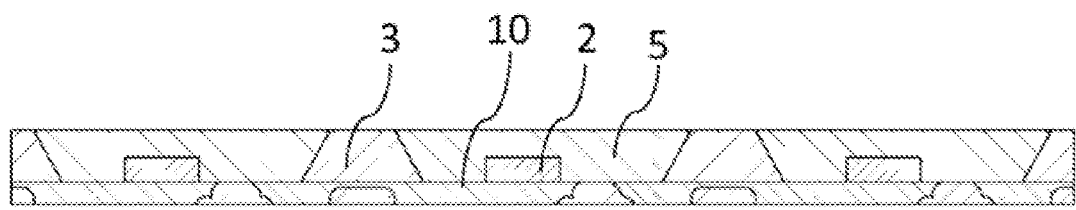
FIG. 4C is a schematic cross-sectional production chart for explaining a method for producing an optical semiconductor device according to an embodiment of the present disclosure.

Next, as shown in FIG. 4C, a light emitting element 2 is mounted on a region of the lead frame 10 on which the resin mold body 3 is formed, where the light emitting element 2 is to be mounted, via a joining member. Then, the light emitting element 2 and the lead frame 10 are connected by a wire. Thereafter, a sealing member 5 is provided inside each of the recessed parts of the resin molded body 3.

Figure 4D:
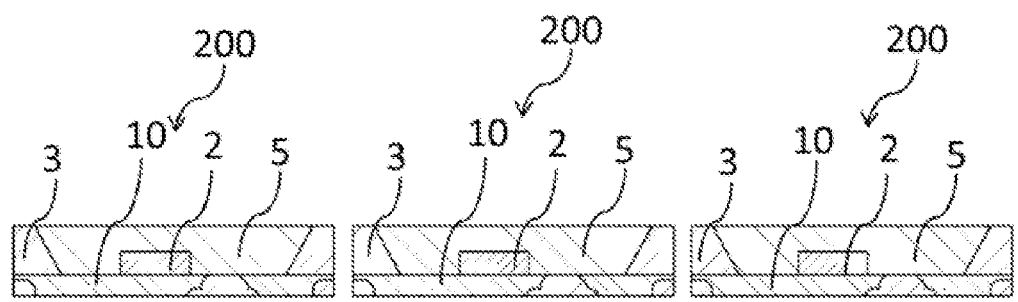
FIG. 4D is a schematic cross-sectional production chart for explaining a method for producing an optical semiconductor device according to an embodiment of the present disclosure.

As shown in FIG. 4D, the lead frame 10 and the resin molded body 3 are cut using a dicing saw, and divided into individual optical semiconductor device as shown in FIG. 3A and FIG. 3B. By this cutting, the cross section of the lead frame 10 is exposed to the outer surface of the optical semiconductor device 200. In the cross section, the copper base body 1a in the metallic structure for an optical semiconductor device 1 constituting the lead frame 10, the nickel or nickel alloy plated layer 1b, optionally the rhodium, palladium, rhodium alloy, or palladium alloy plated layer 1c2, the gold or gold alloy plated layer 1c1, and the indium or indium alloy plated layer 1d are exposed.

Fifth Embodiment

Method for Producing Metallic Structure for Optical Semiconductor Device

Next, a method for producing a metallic structure for an optical semiconductor device will be described.

A method for producing a metallic structure for an optical semiconductor device according to a fifth embodiment includes a step of forming a nickel or nickel alloy plated layer, optionally a step of forming a rhodium, palladium, rhodium alloy, or palladium alloy plated layer, a step of forming a gold or gold alloy plated layer, and a step of forming an indium or indium alloy plated layer having a thickness in a range of 0.002 μm or more and 0.3 μm or less on a base body in this order.

Each step may be performed after a step is formed at a predetermined position of the base body by wet etching.

In the steps of forming each plated layer, each plated layer can be easily formed, and thus the steps are preferably performed according to an electrolytic plating method or a non-electrolytic plating method. Among others, an electrolytic plating method is preferred since the rate of layer formation can be increased and the mass productivity can be improved.

The base body may be subjected to a pretreatment prior to plating.

Examples of the pretreatment may include treatments with acid such as dilute sulfuric acid, dilute nitric acid, and dilute hydrochloric acid, and treatments with alkali such as sodium hydroxide; and these may be performed once or several times, or by combining the same treatments or different treatments. When the pretreatment is performed several times, it is preferable to flowing water washing using pure water after each treatment. When the base body is a metal plate made of copper or an alloy containing copper, it is preferable to use dilute sulfuric acid for the pretreatment. When the base body is a metal plate made of iron or an alloy containing iron, it is preferable to use dilute hydrochloric acid for the pretreatment.

The method for producing a metallic structure for an optical semiconductor device preferably further includes a step of heat treating at a temperature in a range of 200° C. or more and 450° C. or less for a treatment time in a range of 5 minutes or more and 2 hours or less after forming each layer. The heat treatment may be performed in air, an inert atmosphere such as nitrogen gas, or a reducing atmosphere such as hydrogen gas, and is preferably performed in a nitrogen gas atmosphere in order to prevent oxidation of indium contained in the indium or indium alloy plating. The heat treatment method may be a batch treatment such as in a hot air thermostat, or a hot air furnace or an infrared oven may be provided in the final step of the continuous plating apparatus to continuously perform the heat treatments. These heat treatments are preferably performed since an indium or indium alloy plated layer having low melting point and a gold or gold alloy plated layer just under the indium plated layer are appropriately mutually diffused, and adhesion to the molded resin or the sealing resin can be further improved. The temperature of the heat treatment and the treatment time can be determined in consideration of the combination of the thickness of each plated layer.

When the material for constituting the plated layer is pure nickel in the step of forming a nickel or nickel alloy plated layer, the layer can be formed by electrolytic plating using a plating solution containing, for example, nickel sulfamate. When the material is a nickel-phosphorus alloy, the layer can be formed by non-electrolytic plating using a nickel hypophosphite plating solution.

When the material for constituting the plated layer is a palladium alloy in the step of forming a rhodium, palladium, rhodium alloy, or palladium alloy plated layer, the layer can be formed by electrolytic plating using a plating solution containing, for example, tetraammine palladium chloride. When the material for constituting the plated layer is a rhodium alloy, the layer can be formed by electrolytic plating using a plating solution containing rhodium sulfate.

When the material for constituting the plated layer is a gold alloy in the step of forming a gold or gold alloy plated layer, the layer can be formed by electrolytic plating using a plating solution containing, for example, gold potassium cyanide.

A plating solution containing a soluble indium salt in an amount in a range of 0.1 g/L or more and 10 g/L or less in terms of indium concentration and at least one kind of an electrically conductive salt selected from cyanides, sulfates, sulfamic acid salts, and methanesulfonic acid salts in an amount in a range of 0.5 g/L or more and 100 g/L or less is used in the step of forming an indium or indium alloy plated layer. When the amount of the electrically conductive salt contained in the plating solution is in a range of 0.5 g/L or more and 100 g/L or less, neither the electric resistance of the plating solution becomes too high, nor the viscosity of the plating solution becomes excessive. Therefore, the plating solution can be industrially stably used without being lowered of the ion mobility. Further, when the amount of the electrically conductive salt contained in the plating solution is in a range of 0.5 g/L or more and 100 g/L or less, the viscosity of the plating solution does not become excessive, and the amount of a so-called "plating solution carried-out by an object to be plated" is also reduced, so that the indium or indium alloy plating can be economically applied. Examples of the cyanide salt may include potassium cyanide and sodium cyanide. Examples of the sulfate may include potassium sulfate and sodium sulfate. Examples of the sulfamic acid salt may include potassium sulfamate and sodium sulfamate. Examples of the methanesulfonate salt may include potassium methanesulfonate and sodium methanesulfonate.

Examples of the soluble indium salt may include an indium salt of sulfonic acids such as methanesulfonic acid, ethanesulfonic acid, and butanesulfonic acid; an indium salt of sulfamic acid; an indium sulfate; an indium chloride salt; a bromide salt; nitrate; a hydroxide salt; an indium oxide salt; fluoroborate; an indium salt of carboxylic acids such as citric acid, acetic acid, glyoxylic acid, pyruvic acid, glycolic acid, malonic acid, hydroxamic acid, iminodiacetic acid, salicylic acid, glyceric acid, succinic acid, malic acid, tartaric acid, and hydroxybutyric acid; and an indium salt of amino acid. Specifically, as an indium salt to be used for the plating solution, an indium sulfate or an indium salt of sulfamic acid can be used.

In the step of forming an indium or indium alloy plated layer, electrolytic plating is preferably performed using the plating solution under conditions where a liquid temperature of the plating solution is in a range of 20° C. or more and 70° C. or less, a soluble electrode composed of indium or an indium alloy is used as an anode, a cathode current density of the conductive base body is in a range of 0.1 A/dm$^2$ or more and 10 A/dm$^2$ or less, and a plating time is in a range of 5 seconds or more and 10 minutes or less. By forming an indium or indium alloy plated layer under the conditions, an indium or indium alloy plated layer having a thickness in a range of 0.002 μm or more and 0.3 μm or less can be industrially stably and economically formed. When the indium or indium alloy plated layer 1$d$ is formed by electrolytic plating, a brightener such as an Se-based brightener, an Sb-based brightener, an S-based brightener, or an organic brightener may be used in combination, or may not be used in combination.

EXAMPLES

The present disclosure is hereunder specifically described with reference to the following Examples. The present disclosure is not limited to these Examples.

Examples 1 to 11

As shown in FIG. 2A and FIG. 2B, a metallic structure for an optical semiconductor device 1 was produced in such a manner that a nickel or nickel alloy plated layer 1$b$, optionally a rhodium, palladium, rhodium alloy, or palladium alloy plated layer 1$c$2 as a second base layer, a gold or gold alloy plated layer 1$c$1 as a first base layer, and an indium or indium alloy plated layer 1$d$ as a surface layer were formed on the surface of the following base body 1$a$ in this order using each of plating solutions having the following bath compositions according to an electrolytic plating method under each condition. Using each metallic structure for an optical semiconductor device 1, a lead frame 10 was prepared as a pair of lead frames. The thickness of each layer in each of Examples and Comparative Examples is shown in Table 1. In each of Examples 9 and 10, the metallic structure for an optical semiconductor device 1 was subjected to heat treatment at the temperature and time shown in Table 1. The plating time was adjusted in a range of 5 seconds or more and 10 minutes or less.

Base Body 1a

Copper base body: a TAMAC 194 material manufactured by Mitsubishi Shindoh Co., Ltd. that was made into a lead frame shape using a press die was used.

42 alloy base body: an iron-nickel alloy of 42% Ni—Fe manufactured by DOWA Metanix Co., Ltd. that was made into a lead frame shape using a press die was used.

Iron material: an SPCE-SB material manufactured by Nippon Steel Corp. that was made into a lead frame shape using a press die was used.

Nickel or Nickel Alloy Plated Layer 1b

As for the nickel plated layer 1b, a plating solution having the following bath compositions was used as a standard sulfamic acid electrolytic plating bath.

Nickel or Nickel Alloy Plating Solution
 Nickel sulfamate: 450 g/L
 Nickel chloride: 10 g/L
 Boric acid: 30 g/L
 pH 4.0

Using the plating solution, electrolytic plating was performed under the conditions where the plating time was adjusted, the liquid temperature was 55° C., and the cathode current density was 5 A/dm$^2$ to produce a nickel plated layer. As the anode, a sulfur-added nickel plate was used.

In Example 5, a suitable amount of tin sulfate was further added to the bath composition of the plating solution to produce a nickel-tin alloy plated layer 1b.

In Example 7, a suitable amount of cobalt sulfamate was further added to the bath composition of the plating solution to produce a nickel-cobalt alloy plated layer 1b.

In Example 9, a suitable amount of phosphorous acid was further added to the bath composition of the plating solution to produce a nickel-phosphorus alloy plated layer 1b.

Gold or Gold Alloy Plated Layer 1c1

In each of Examples 1, 4, 5, 7 to 11 and Comparative Example 1 described below, the thickness of the gold plated layer 1c1 was 0.1 μm or less, and thus a plating solution having the following bath compositions was used as a weak acidic electrolytic gold plating bath.

Gold or Gold Alloy Plating Solution 1
 Gold potassium cyanide: 5 g/L in terms of gold
 Potassium citrate: 120 g/L
 Citric acid: 10 g/L
 Potassium phosphate: 40 g/L
 Thallium sulfate: 10 mg/L in terms of thallium
 pH 6.3

Using the plating solution, electrolytic plating was performed under the conditions where the plating time was adjusted, the liquid temperature was 68° C., and the cathode current density was 0.8 A/dm$^2$ to produce a gold plated layer 1c1. As the anode, a platinum-coated titanium electrode was used.

In Example 10, a suitable amount of cobalt sulfate was further added to the bath composition of the gold plating solution to produce a gold-cobalt alloy plated layer 1c1.

In the gold plated layer 1c1 of each of Examples 2, 3, 6, and Comparative Examples 2 to 3 described below, the gold plating thickness was thin as 0.1 μm or less, and thus a plating solution having the following bath compositions was used.

Gold or Gold Alloy Plating Solution 2
 Gold potassium cyanide: 1 g/L in terms of gold
 Potassium citrate: 80 g/L
 Citric acid: 10 g/L
 Potassium phosphate: 50 g/L
 pH 4.0

Using the plating solution, electrolytic plating was performed under the conditions where the plating time was adjusted, the liquid temperature was 40° C., and the cathode current density was 2 A/dm$^2$ to produce a gold plated layer. As the anode, a platinum-coated titanium electrode was used.

Indium or Indium Alloy Plated Layer 1d

As for the indium plated layer 1d, a plating solution having the following bath compositions was used as an electrolytic indium plating bath.

Indium or Indium Alloy Plating Solution
 Indium sulfate: 5 g/L in terms of indium
 Sodium sulfate: 10 g/L
 pH 2.0

Using the plating solution, electrolytic plating was performed under the conditions where the plating time was adjusted, the liquid temperature was 30° C., and the cathode current density was 0.8 A/dm$^2$ to produce an indium plated layer. As the anode, an indium electrode was used.

In Example 4, a suitable amount of silver nitrate was added to the bath composition of the plating solution to produce an indium-silver alloy plated layer 1d.

In Example 8, a suitable amount of chloroauric acid was added to the bath composition of the plating solution to produce an indium-gold alloy plated layer 1d.

Rhodium, Palladium, Rhodium Alloy, or Palladium Alloy Plated Layer 1c2

As for the palladium plated layer 1c2 in each of Examples 2, 6, 9, 10, and Comparative Examples 2 to 3 described below, a plating solution having the following bath compositions was used.

Palladium or Palladium Alloy Plating Solution
 Tetraammine palladium chloride: 5 g/L in terms of palladium
 Ammonium nitrate: 150 g/L
 Sodium 3-pyridine sulfonate: 5 g/L
 pH 8.5

Using the plating solution, electrolytic plating was performed under the conditions where the plating time was adjusted, the liquid temperature was 50° C., and the cathode current density was 1 A/dm$^2$ to produce a palladium plated layer. As the anode, a platinum-coated titanium electrode was used.

In Example 6, a suitable amount of nickel sulfate was added to the plating solution having the bath compositions to produce a palladium-nickel alloy plated layer 1c2.

As for the rhodium or rhodium alloy plated layer 1c2 in each of Examples 3 and 8, a plating solution having the following bath compositions was used.

Rhodium or Rhodium Alloy Plating Solution
 Rhodium sulfate: 2 g/L in terms of rhodium
 Sulfuric acid: 50 g/L
 Lead sulfate: 10 mg/L in terms of lead Using the plating solution, electrolytic plating was performed under the conditions where the plating time was adjusted, the liquid temperature was 45° C., and the cathode current density was 1 A/dm$^2$ to produce a rhodium plated layer. As the anode, a platinum-coated titanium electrode was used.

In Example 8, a suitable amount of cobalt sulfate was added to the plating solution having the bath compositions to produce a rhodium-cobalt alloy plated layer 1c2.

Comparative Examples 1 to 3

In Comparative Example 1, a metallic structure, in which no indium or indium alloy plated layer was formed, having the same structure as that in each Example was prepared. In each of Comparative Examples 2 to 3, a metallic structure in which the thickness of the indium or indium alloy plated layer 1d was changed was prepared. An optical semiconductor device having substantially the same structure as that of the optical semiconductor device shown in FIG. 1A and FIG. 1B was produced in the same manner as in Example 1 except that a lead frame 10 as a pair of lead frames was prepared using each of the metallic structures, and the lead frame 10 was then used.

Reflectance and b* Value in L*a*b* Color System

Using an apparatus for measuring micro part reflectance MCPD manufactured by Otsuka Electronics Co., Ltd., the metallic structure for an optical semiconductor device in each of Examples and Comparative Examples was irradiated with light having a light emission peak wavelength at 450 nm to measure the reflectance. Further, using a color-difference meter VSS-400 manufactured by Nippon Denshoku Industries Co., Ltd., the b* value in the L*a*b* color system was measured. The results are shown in Table 1.

Optical Semiconductor Device

Next, using the metallic structure for an optical semiconductor device in each of Examples and Comparative Examples for a lead frame, an optical semiconductor device having substantially the same structure as that of the optical semiconductor device shown in FIG. 1A and FIG. 1B was produced. The semiconductor device 100 is subjected to each step in the state of the assembly where a plurality of the resin molded bodies 3 are molded on the lead frames 10 in a state of being connected by a plurality of the pair of lead frames 10 until the semiconductor device 100 is divided into individual pieces. However, for convenience sake, the semiconductor device 100 is described as one semiconductor device 100 (one piece) as shown in FIG. 1A and FIG. 1B. Using the lead frames 10, an optical semiconductor device in each of Examples and Comparative Examples, which had substantially the same structure as that of the optical semiconductor device shown in FIG. 1A and FIG. 1B, was produced.

The resin molded body 3 had a recessed part, and the metallic structure for an optical semiconductor device 1 was exposed on the bottom surface of the recessed part. The light emitting element 2, which had a rectangular shape in plan view, comprising positive and negative electrodes on the upper surface was placed on the metallic structure for an optical semiconductor device 1 via the joining member 4 composed of an insulating resin, and then joined. Thereafter, a sealing material containing a YAG fluorescent material and a translucent resin was dropped into the recessed part according to a potting method, to thereby form the sealing member 5.

Presence or Absence of Solder Entering and Sealing Resin-Leakage in Resin Molded Body The optical semiconductor device in each of Examples and Comparative Examples was placed on a printed board coated with a lead-free solder (Sn-0.3Ag-0.7Cu) paste, and was mounted at a reflow temperature of 260° C. for 10 seconds. Thereafter, the optical semiconductor device after reflow was peeled off to evaluate whether or not solder entering was present in the resin molded body 3, as well as the presence or absence of leakage of the sealing material (sealing resin), using a stereo-microscope at a magnification of 40. The evaluation results are shown in Table 1.

Total Luminous Flux Retention Rate After Sulfidation Resistant Test

In order to evaluate sulfidation resistant reliability, the optical semiconductor device in each of Examples and Comparative Examples was exposed with a mixed gas containing 2 ppm of $H_2S$ and 4 ppm of $NO_2$ for 500 hours under an environment of a temperature of 40° C. and a humidity of 75% RH. Then, the total luminous fluxes of light emitted from the optical semiconductor device before and after the exposure treatment were measured, and the ratio obtained by dividing the total luminous flux after the exposure treatment by the total luminous flux before the exposure treatment was measured as a retention rate of the total luminous flux. The results are shown in Table 1.

TABLE 1

| | Metallic structure for Optical Semiconductor Device | | | | | | | | |
|---|---|---|---|---|---|---|---|---|---|
| | | Nickel or Nickel Alloy Plated Layer 1b | | Second Base Layer 1c2 | | Gold or Gold Alloy Plated Layer: First Base Layer 1c1 | | Indium or Indium Alloy Plated Layer 1d | | |
| Type of | Base Body 1a | Type | Thickness (μm) | Type | Thickness (μm) | Type | Thickness (μm) | Type | Thickness (μm) | Heat Treatment |
| Ex. 1 | Copper Alloy 194 | Ni | 2.0 | Non | — | Au | 0.20 | In | 0.003 | Non |
| Ex. 2 | Copper Alloy 194 | Ni | 1.0 | Pd | 0.02 | Au | 0.02 | In | 0.100 | Non |
| Ex. 3 | Copper Alloy 194 | Ni | 8.0 | Rh | 0.03 | Au | 0.04 | In | 0.200 | Non |
| Ex. 4 | Copper Alloy 194 | Ni | 10.0 | Non | — | Au | 1.00 | InAg Alloy | 0.005 | Non |
| Ex. 5 | Copper Alloy 194 | NiSn Alloy | 2.0 | Non | — | Au | 0.50 | In | 0.010 | Non |
| Ex. 6 | Copper Alloy 194 | Ni | 2.0 | PdNi Alloy | 0.05 | Au | 0.01 | In | 0.002 | Non |
| Ex. 7 | Copper Alloy 194 | NiCo Alloy | 2.0 | Non | — | Au | 0.70 | In | 0.008 | Non |
| Ex. 8 | 42 Alloy | Ni | 2.0 | RhCo Alloy | 0.02 | Au | 0.40 | InAu Alloy | 0.010 | Non |
| Ex. 9 | Copper Alloy 194 | NiP Alloy | 2.0 | Pd | 0.30 | Au | 0.90 | In | 0.200 | 250° C. × 2 hours |
| Ex. 10 | Copper Alloy 194 | Ni | 3.0 | Pd | 0.01 | AuCo Alloy | 0.30 | In | 0.080 | 450° C. × 5 min. |

TABLE 1-continued

| | | | | | | | | | | |
|---|---|---|---|---|---|---|---|---|---|---|
| Ex. 11 | Iron Material | Ni | 7.0 | Non | — | Au | 0.20 | In | 0.003 | Non |
| Comp. Ex. 1 | Copper Alloy 194 | Ni | 2.0 | Non | — | Au | 0.20 | Non | — | Non |
| Comp. Ex. 2 | Copper Alloy 194 | Ni | 1.0 | Pd | 0.02 | Au | 0.02 | In | 0.001 | Non |
| Comp. Ex. 3 | Copper Alloy 194 | Ni | 1.0 | Pd | 0.02 | Au | 0.02 | In | 0.350 | Non |

| | Evaluation Result | | | | |
|---|---|---|---|---|---|
| | Presence or Absence of Solder Entering in Resin Molded Body | Presence or Absence of Sealing Resin-Leakage | Total Luminous Flux Retention Rate (%) | Reflectance (%) | b* value |
| Ex. 1 | Absence | Absence | 99 | 36 | 36 |
| Ex. 2 | Absence | Absence | 99 | 75 | 2 |
| Ex. 3 | Absence | Absence | 99 | 77 | 1 |
| Ex. 4 | Absence | Absence | 99 | 49 | 21 |
| Ex. 5 | Absence | Absence | 99 | 42 | 5 |
| Ex. 6 | Absence | Absence | 99 | 35 | 34 |
| Ex. 7 | Absence | Absence | 99 | 55 | 12 |
| Ex. 8 | Absence | Absence | 99 | 51 | 5 |
| Ex. 9 | Absence | Absence | 99 | 82 | 7 |
| Ex. 10 | Absence | Absence | 99 | 73 | 2 |
| Ex. 11 | Absence | Absence | 99 | 34 | 42 |
| Comp. Ex. 1 | Presence | Presence | 99 | 24 | 42 |
| Comp. Ex. 2 | Presence | Presence | 99 | 29 | 34 |
| Comp. Ex. 3 | Presence | Presence | 99 | 88 | 0 |

As for the optical semiconductor device in each of Examples 1 to 11, the solder entered in the resin molded body 3 was not observed, the leakage of the sealing resin from the resin molded body 3 to the outside was not observed, and thus the adhesion between the resin material and the lead frame 10 was excellent. The optical semiconductor device in each of Examples 1 to 11 and Comparative Examples 1 and 3 maintained the total luminous flux almost similar to that before the sulfidation test even after the sulfidation test. Further, in the metallic structure for an optical semiconductor device in each of Examples 1 to 11, the reflectance with respect to light having a light emission peak wavelength at 450 nm was in a range of 30% or more and 90% or less, and the chromaticity which was represented by the b* value in the L*a*b* color system was in a range of 0 or more and 40 or less. The metallic structure for an optical semiconductor device in each of Examples 1 to 11 had the desired reflectance and chromaticity, and was excellent in adhesion to the resin material constituting the member.

As for the optical semiconductor device in each of Comparative Examples 1 to 3, the solder entered in the resin molded body 3 was observed, the leakage of the sealing resin from the resin molded body 3 to the outside was observed, and thus the adhesion between the resin material constituting the member and the lead frame 10 was not improved. As for the optical semiconductor device in Comparative Example 2, since the thickness of the indium or indium alloy plated layer 1d serving as a surface layer was very thin as 0.001 µm, the reflectance with respect to light having a light emission peak wavelength at 450 nm was less than 30%, and the adhesion to the resin material was not improved. As for the optical semiconductor device in Comparative Example 3, since the thickness of the indium or indium alloy plated layer 1d serving as a surface layer was relatively thick as 0.35 µm, the melting point of the metallic structure for an optical semiconductor device constituting a lead frame 10 was remarkably lowered. Thereby, the optical semiconductor device was melted by heat at the time of reflow, the adhesion to the resin material constituting the resin molded body 3 was lowered, the solder entered into the resin molded body 3, and the leakage of the sealing resin from the resin molded body 3 to the outside was observed.

The invention claimed is:

1. A metallic structure for an optical semiconductor device, comprising a conductive base body having disposed thereon metallic layers in the following order: a nickel or nickel alloy plated layer, a gold or gold alloy plated layer, and an indium or indium alloy plated layer, wherein the indium or indium alloy plated layer has a thickness in a range of 0.002 µm or more and 0.3 µm or less.

2. The metallic structure for an optical semiconductor device according to claim 1, further comprising a rhodium, palladium, rhodium alloy, or palladium alloy plated layer disposed between the nickel or nickel alloy plated layer and the gold or gold alloy plated layer.

3. The metallic structure for an optical semiconductor device according to claim 1, wherein a thickness of the nickel or nickel alloy plated layer is in a range of 0.5 µm or more and 10 µm or less.

4. The metallic structure for an optical semiconductor device according to claim 2, wherein a thickness of the nickel or nickel alloy plated layer is in a range of 0.5 µm or more and 10 µm or less.

5. The metallic structure for an optical semiconductor device according to claim 1, wherein a thickness of the gold or gold alloy plated layer is in a range of 0.01 µm or more and 1 µm or less.

6. The metallic structure for an optical semiconductor device according to claim 2, wherein a thickness of the rhodium, palladium, rhodium alloy, or palladium alloy plated layer is in a range of 0.01 μm or more and 0.3 μm or less.

7. The metallic structure for an optical semiconductor device according to claim 1, wherein a reflectance with respect to light having a light emission peak wavelength at 450 nm is in a range of 30% or more and 90% or less.

8. The metallic structure for an optical semiconductor device according to claim 1, wherein a b* value in the L*a*b* color system is in a range of 0 or more and 40 or less.

9. An optical semiconductor device, wherein a light emitting element is mounted on a lead frame or a substrate composed of the metallic structure for an optical semiconductor device according to claim 1.

10. The optical semiconductor device according to claim 9, having an area in contact with a member that is formed on a part of the surface of the lead frame or the substrate composed of the metallic structure for an optical semiconductor device by using a resin material.

* * * * *